United States Patent
Faucher et al.

(10) Patent No.: US 8,932,931 B2
(45) Date of Patent: Jan. 13, 2015

(54) SELF-ALIGNED EMITTER-BASE REGION

(75) Inventors: Margaret A. Faucher, South Burlington, VT (US); Paula M. Fisher, Milton, VT (US); Thomas H. Gabert, Essex Junction, VT (US); Joseph P. Hasselbach, Burlington, VT (US); Qizhi Liu, Lexington, MA (US); Glenn C. MacDougall, Covington, LA (US)

(73) Assignee: International Business Machines Corporation, Armonk, NY (US)

( * ) Notice: Subject to any disclaimer, the term of this patent is extended or adjusted under 35 U.S.C. 154(b) by 376 days.

(21) Appl. No.: 13/371,605

(22) Filed: Feb. 13, 2012

(65) Prior Publication Data

US 2013/0207235 A1   Aug. 15, 2013

(51) Int. Cl.
*H01L 21/331* (2006.01)
*H01L 29/66* (2006.01)

(52) U.S. Cl.
CPC ..... *H01L 29/66234* (2013.01); *H01L 29/66242* (2013.01); *H01L 29/66272* (2013.01)
USPC .......... 438/364; 438/205; 438/313; 438/318; 438/340; 257/565; 257/566; 257/318; 257/E29.174; 257/E21.37

(58) Field of Classification Search
CPC ...................... H01L 29/66234; H01L 29/1004; H01L 29/732; H01L 29/66242; H01L 29/0649; H01L 29/0821; H01L 29/7371; H01L 29/66272
USPC .......... 438/364, 205, 313, 318, 340; 257/565, 257/566, 318, E29.174, E21.37
See application file for complete search history.

(56) References Cited

U.S. PATENT DOCUMENTS

| | | | |
|---|---|---|---|
| 4,338,138 A | 7/1982 | Cavaliere et al. | |
| 5,106,767 A * | 4/1992 | Comfort et al. | 438/359 |
| 5,358,883 A | 10/1994 | Burger et al. | |
| 5,729,033 A | 3/1998 | Hafizi | |
| 6,680,235 B1 | 1/2004 | U'Ren et al. | |
| 6,869,853 B1 | 3/2005 | Gopalan | |
| 7,687,887 B1 | 3/2010 | El-Diwany et al. | |
| 7,709,338 B2 | 5/2010 | Liu et al. | |
| 2007/0023864 A1 | 2/2007 | Khater | |

OTHER PUBLICATIONS

Huylenbroeck et al., "A 400GHz fmax Fully Self-Aligned SiGe:C HBT Architecture", IEEE BCTM 1.2, 2008, pp. 5-8.

* cited by examiner

*Primary Examiner* — Thinh T Nguyen
(74) *Attorney, Agent, or Firm* — Michael J. LeStrange; Hofffman Warnick LLC

(57) ABSTRACT

Aspects of the invention provide a method of forming a bipolar junction transistor. The method includes: providing a semiconductor substrate including a uniform silicon nitride layer over an emitter pedestal, and a base layer below the emitter pedestal; applying a photomask at a first end and a second end of a base region; and performing a silicon nitride etch with the photomask to simultaneously form silicon nitride spacers adjacent to the emitter pedestal and exposing the base region of the bipolar junction transistor. The silicon nitride etch may be an end-pointed etch.

15 Claims, 8 Drawing Sheets

SELF-ALIGNED EMITTER-BASE REGION

FIELD OF THE INVENTION

The disclosure relates generally to integrated circuit (IC) devices and fabrication, and more particularly, to a bipolar junction transistor including a self-aligned emitter-base region, and a related method.

BACKGROUND

In BiCMOS technology, bipolar transistors are integrated with CMOS transistors within a single integrated circuit (IC) device. In integrating these two different technologies, it is generally desirable to build a bipolar device that performs at fast speed. An important figure of merit to determine whether the device performs fast enough is the maximum frequency.

The maximum frequency of oscillation (fmax) is the maximum frequency for the transistor where the power gain is equal to one. A faster transistor will have a high fmax. In order to produce a faster transistor, the base resistance must also be lower.

BRIEF SUMMARY

A first aspect of the disclosure provides a method of forming a bipolar junction transistor, comprising: providing a semiconductor substrate including a uniform silicon nitride layer over an emitter pedestal, and a base layer below the emitter pedestal; applying a photomask at a first end and a second end of a base region; and performing a silicon nitride etch with the photomask to simultaneously form silicon nitride spacers adjacent to the emitter pedestal and exposing the base region of the bipolar junction transistor.

A second aspect of the disclosure provides a method of forming a bipolar junction transistor, comprising: providing a semiconductor substrate including a uniform silicon nitride layer over a sacrificial emitter pedestal, and a uniform silicon oxide layer and a base layer below the sacrificial emitter pedestal; applying a photomask at a first end and a second end of a base region; performing a silicon nitride etch with the photomask to simultaneously form silicon nitride spacers adjacent to the emitter pedestal and exposing the base region of the bipolar junction transistor; performing an oxide etch to further expose the base region of the bipolar junction transistor; and depositing an extrinsic base layer via selective epitaxy, such that the extrinsic base layer is only within the exposed base region.

A third aspect of the disclosure provides a bipolar junction transistor, comprising: a base region defined by first silicon nitride portion and a second silicon nitride portion positioned at a first end and a second end, respectively, of the base region; an emitter defined by a sacrificial emitter pedestal positioned atop of the base layer and between the first and second silicon nitride portions; and an extrinsic base layer in the base region of the bipolar junction transistor, the base region between the sacrificial emitter pedestal and the first and second silicon nitride portions.

BRIEF DESCRIPTION OF THE DRAWINGS

The above and other aspects, features and advantages of the disclosure will be better understood by reading the following more particular description of the disclosure in conjunction with the accompanying drawings.

Figure 1:
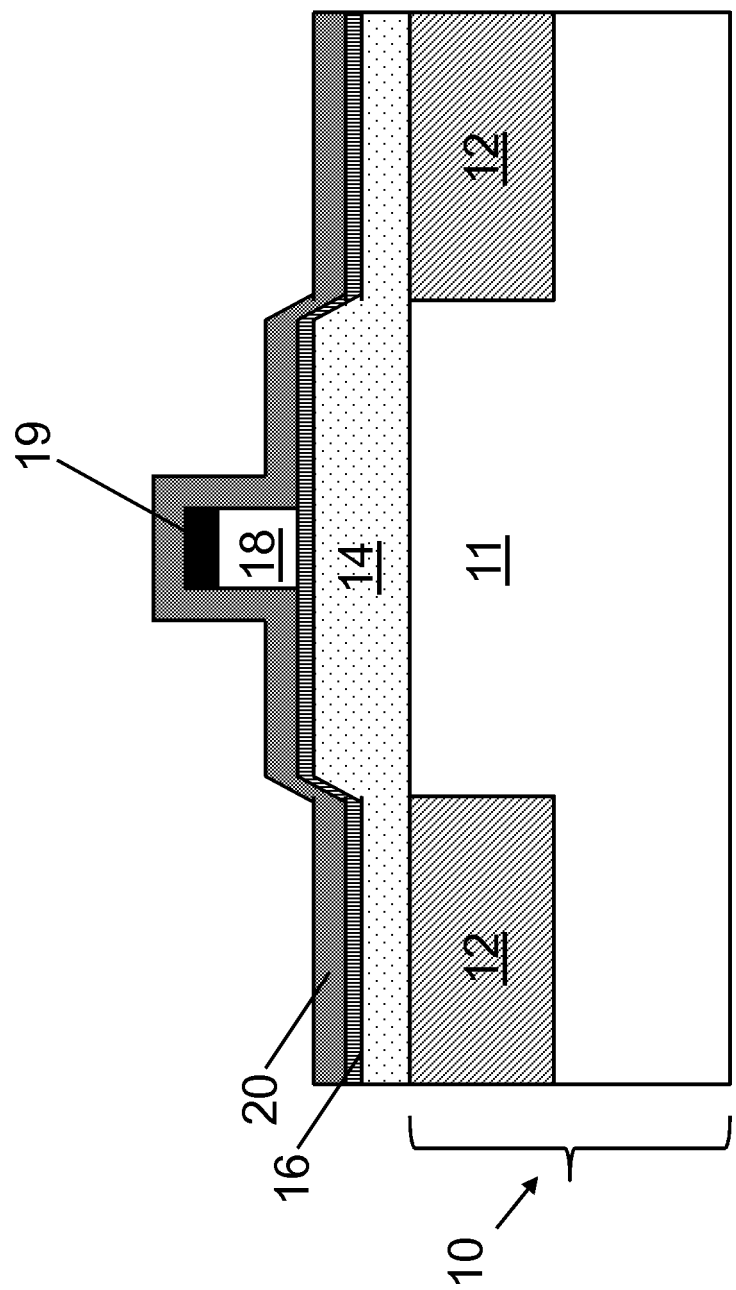
FIG. 1 shows a cross-sectional side view of a method of forming a bipolar junction transistor according to embodiments of the invention.

The drawings are not necessarily to scale. The drawings are merely schematic representations, not intended to portray specific parameters of the disclosure. The drawings are intended to depict only typical embodiments of the disclosure, and therefore should not be considered as limiting the scope of the disclosure. In the drawings, like numbering represents like elements.

DETAILED DESCRIPTION

The disclosure relates generally to integrated circuit (IC) devices and fabrication, and more particularly, to a transistor including a self-aligned emitter-base region, and a related method.

In BiCMOS technology, bipolar transistors are integrated with CMOS transistors within a single integrated circuit (IC) device. In integrating these two different technologies, it is generally desirable to build a bipolar device that performs at fast speed. An important figure of merit to determine whether the device performs fast enough is the maximum frequency.

The maximum frequency of oscillation (fmax) is the maximum frequency for the transistor where the power gain is equal to one. A faster transistor will have a high fmax. In order to produce a faster transistor, the base resistance must also be lower.

Aspects of the invention provide a method of forming a bipolar junction transistor. The method includes: providing a semiconductor substrate including a uniform silicon nitride layer over an emitter pedestal, and a base layer below the emitter pedestal; applying a photomask at a first end and a second end of a base region; and performing a silicon nitride etch with the photomask to simultaneously form silicon nitride spacers adjacent to the emitter pedestal and exposing the base region of the bipolar junction transistor. The silicon nitride etch may be an end-pointed etch.

Turning now to FIG. 1, a method of forming a bipolar junction transistor 100 (FIG. 7) is shown. A semiconductor substrate 10 including shallow trench isolation (STI) regions 12 is provided. Substrate 10 may be any suitable bulk substrate containing a semiconductor material that a person having ordinary skill in the art would recognize as suitable for forming an integrated circuit. For example, substrate 10 may be comprised of a monocrystalline silicon-containing material, such as single crystal silicon with a (100) crystal lattice orientation. The monocrystalline semiconductor material contained in the substrate 10 may contain a definite defect concentration and still be considered a single crystal. The semiconductor material constituting substrate 10 may be lightly doped with an impurity to alter its electrical properties.

Between STI regions 12 is a device region 11. Below device region 11 and STI regions 12 is a sub-collector region (not shown), as known in the art. A doped portion of device region 11 forms the electrically active collector region (not shown).

Figure 5:
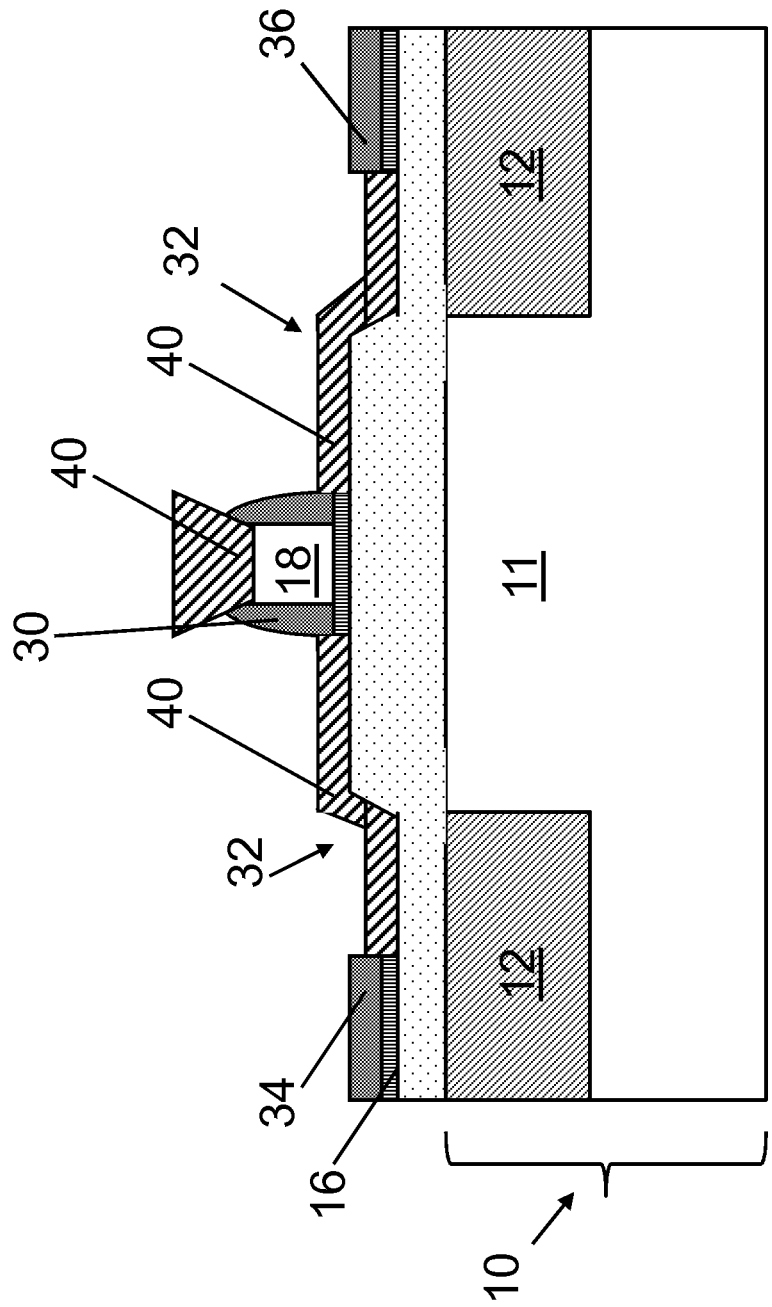
FIG. 5 shows a cross-sectional side view of a method of forming a bipolar junction transistor according to embodiments of the invention.

STI regions 12 may be formed by a conventional process in the substrate 10. In one embodiment, STI regions 12 may be formed by a STI technique that relies on lithography and a dry etching process to define the closed-bottomed trenches in substrate 10, fills the trenches with dielectric material, and planarizes the surface of substrate 10 using a chemical mechanical polishing (CMP) process. The dielectric may be an oxide of silicon, such as densified tetraethylorthosilicate (TEOS) deposited by chemical vapor deposition (CVD) or a high-density plasma (HDP) oxide deposited with plasma assistance. The STI regions 12 circumscribe and electrically isolate the device region 11 of the substrate 10, between STI regions 12, that is used in the fabrication of the bipolar junction transistor 100 (FIG. 5).

Using a low temperature epitaxial (LTE) growth process (typically at a growth temperature ranging from 400° C. to 850° C.), a base layer 14 may be deposited over semiconductor substrate 10. Base layer 14 may include materials suitable for forming an intrinsic base of the bipolar junction transistor 100 (FIG. 5). Base layer 14 may be comprised of a semiconductor material $Si_xGe_{1-x}$ including silicon (Si) and germanium (Ge) with the germanium content ranging from about 5 atomic percent and about 50 atomic percent. The germanium content of the intrinsic base layer 14 may be uniform or the germanium content of intrinsic base layer 14 may be graded or stepped across the thickness of intrinsic base layer 14. Base layer 14 over STI regions 12 is thinner than base layer 14 over the device region 11 of the semiconductor substrate 10. Base layer 14 includes a monocrystalline region above device region 11 and a polycrystalline region over STI regions 12. The thickness of the base layer 14 may range from approximately 10 nm to approximately 600 nm, with the largest layer thickness above device region 11. As the thickness of the base layer 14 increases, the width of the base layer 14 above the device region 11 likewise increases.

A uniform silicon dioxide layer 16 is deposited over base layer 14. Silicon dioxide layer 16 may be a high temperature oxide (HTO) that is deposited using rapid thermal chemical vapor deposition (RTCVD) at temperatures of 500° C. or higher. However, it is understood that silicon dioxide layer 16 may be deposited or grown by another suitable deposition process. A thickness of oxide layer 16 may be approximately 50 Angstroms to approximately 300 Angstroms.

A sacrificial emitter pedestal 18 including, for example, polysilicon, is positioned atop of silicon oxide layer 16. Emitter pedestal 18 may include a cap layer 19. Cap layer 19 may be silicon dioxide and/or silicon nitride. As known in the art, the sacrificial emitter pedestal 18 may be formed using a deposition, photolithography and etch process. A uniform silicon nitride layer 20 is deposited over the sacrificial emitter pedestal 18 and semiconductor substrate 10. Silicon nitride layer 20 may be deposited using, for example, chemical vapor deposition (CVD), or plasma-enhanced CVD, as known in the art. A thickness of nitride layer 20 may be approximately 100 Angstroms to approximately 2000 Angstroms.

Figure 2:
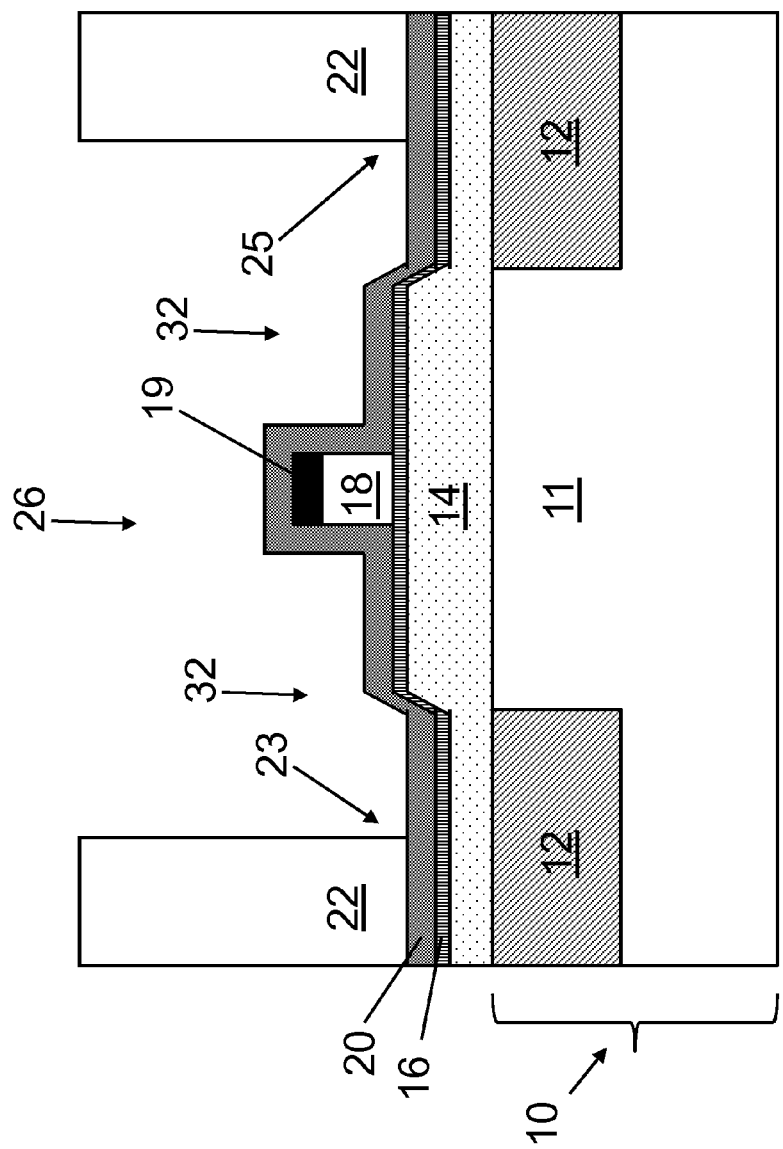
FIG. 2 shows a cross-sectional side view of a method of forming a bipolar junction transistor according to embodiments of the invention.

Turning now to FIG. 2, a photomask 22 is applied at a first end 23 of base region 32 and a second end 25 of base region 32. That is, the photomask 22 is applied over the portions of base layer 14 that are over STI regions 12. A thickness of each photomask 22 is approximately 5000 Angstroms to approximately 2 microns. Photomasks 22 are formed using a mask to expose the center portion 26. The photomasks 22 may be formed using one of: a positive or a negative resist. If a positive resist is used, the mask 22 is over the first end 23 and the second end 25, and the unblocked portion (i.e., the center portion 26) is etched out. If a negative resist is used, the mask is over the center portion 26, such that the first end 23 and the second end 25 are exposed. In a negative resist, only the unexposed portion (i.e., the center portion 26) is removed by the photolithography process.

Figure 3:
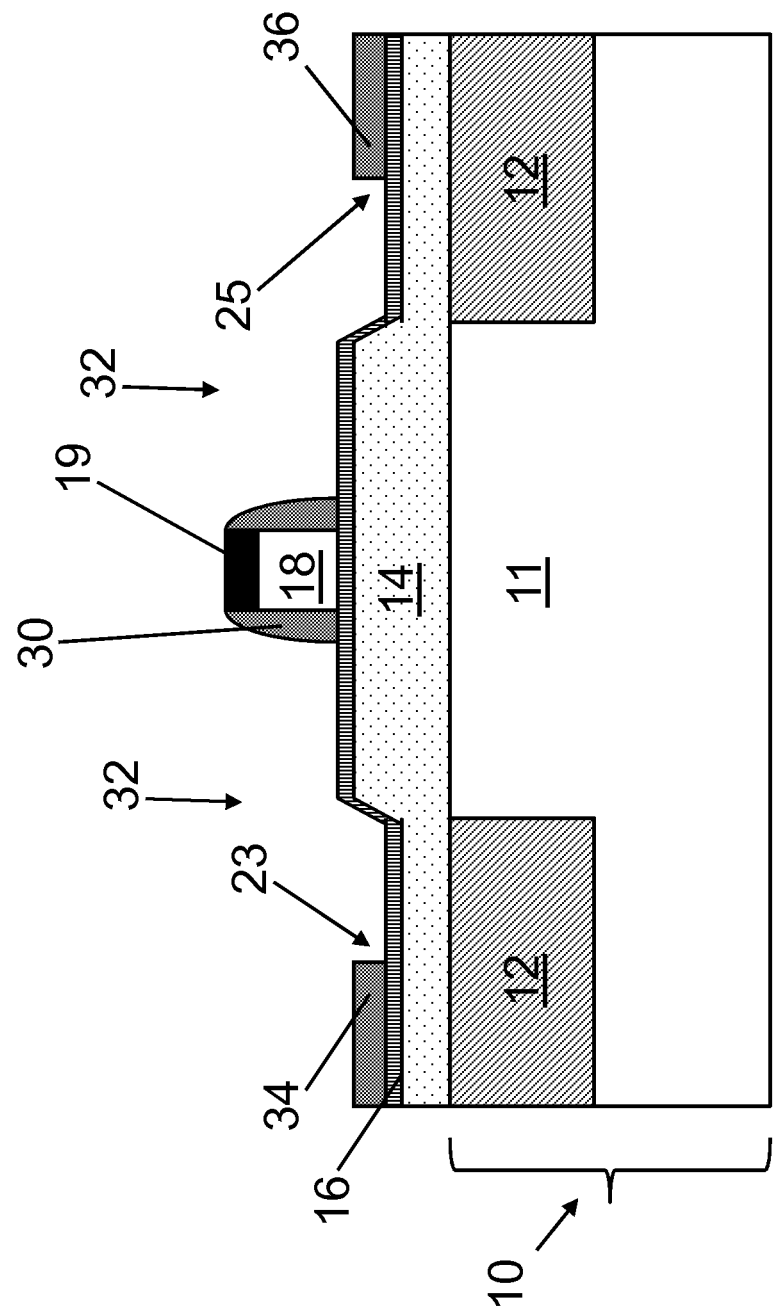
FIG. 3 shows a cross-sectional side view of a method of forming a bipolar junction transistor according to embodiments of the invention.

Turning now to FIG. 3, a silicon nitride etch with the photomasks 22 (FIG. 2) is performed to simultaneously form silicon nitride spacers 30 adjacent to the emitter pedestal 18 and to expose extrinsic base regions 32. This silicon nitride etch is an end-pointed etch, which monitors character wavelengths of an etch product of the silicon nitride layer 20 to determine when to stop the etch. That is, the silicon nitride etch ends when it reaches silicon dioxide layer 16. A first silicon nitride portion 34 remains at first end 23 of base region 32 and a second silicon nitride portion 36 remains at second end 25 of base region 32. This silicon nitride etch is a directional etch, such that the etch is vertical to form silicon nitride spacers 30.

Figure 4:
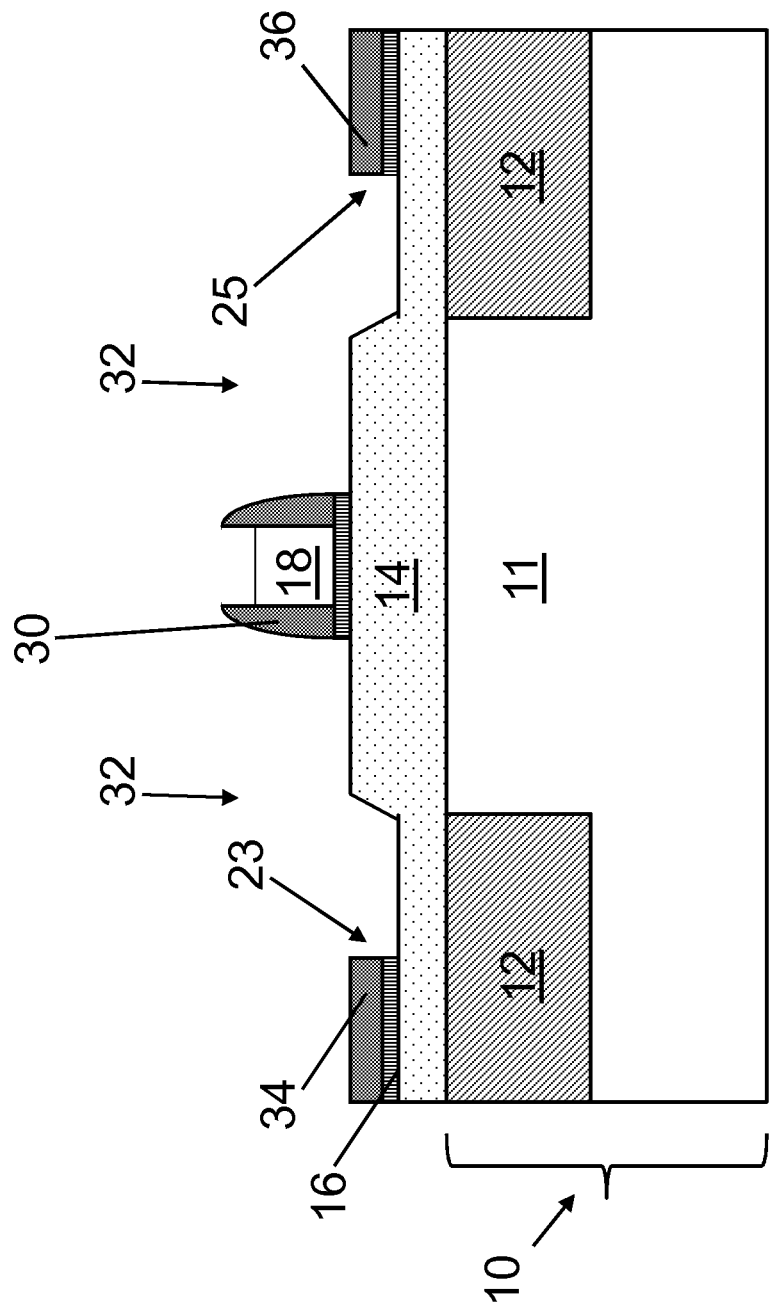
FIG. 4 shows a cross-sectional side view of a method of forming a bipolar junction transistor according to embodiments of the invention.

Turning now to FIG. 4, an oxide etch may be performed to further expose the extrinsic base regions 32 of the bipolar junction transistor 100 by removing silicon dioxide layer 16 to prepare for selective epitaxy in the following step. A chemical etch, such as chemical oxide removal (COR) followed by a short pre-epitaxy clean may be used with minimal undercut into the silicon oxide layer 16 that is under the sacrificial emitter pedestal 18 and silicon nitride spacers 30. The cap 19 (FIG. 3) over emitter pedestal 18 may also be etched at the same time.

Figure 6:
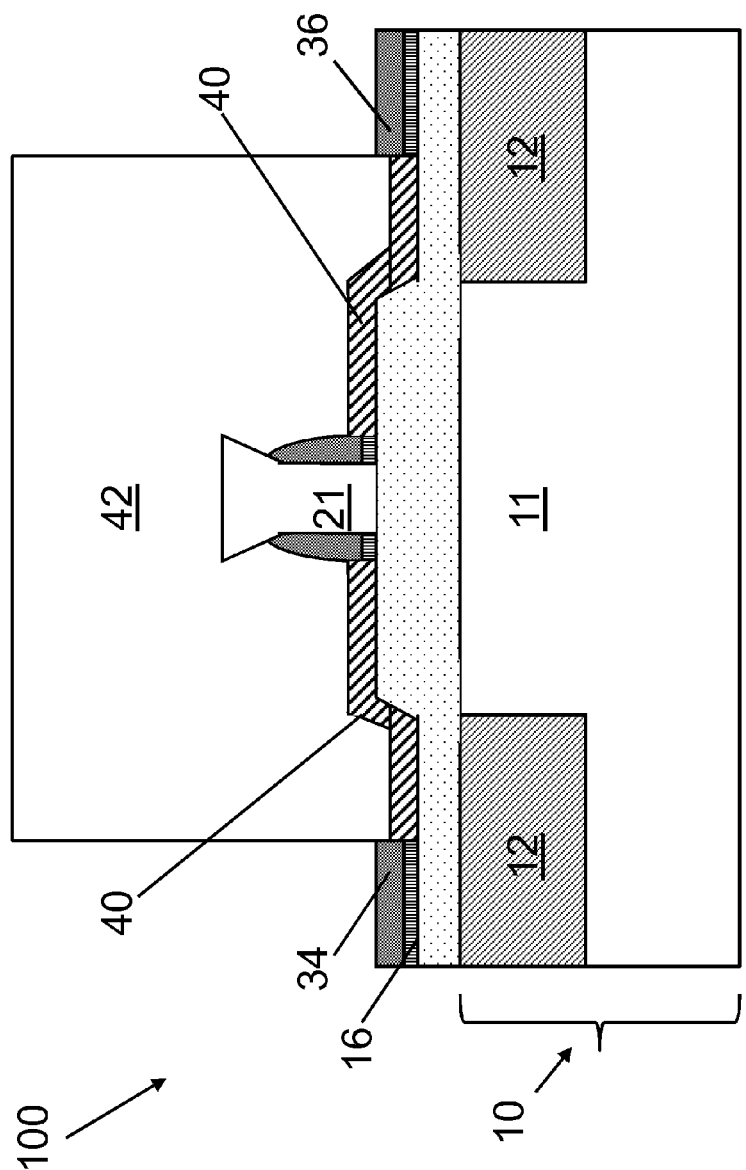
FIG. 6 shows a cross-sectional side view of a method of forming a bipolar junction transistor according to embodiments of the invention.

Turning now to FIG. 5, a selective epitaxial layer 40 is deposited via selective epitaxy to form an extrinsic base. The selective epitaxial layer 40 (i.e., extrinsic base layer) only grows on regions 32 where single crystalline silicon or polysilicon is exposed. The selective epitaxial layer 40 is not over nitride spacers 30 or over first and second nitride portions 34, 36. This forms a raised extrinsic base in regions 32. The selective epitaxial layer 40 may be one of: silicon or silicon germanium or a layered structure with various germanium profiles. Several steps would follow with details omitted here. These steps include removing selective epitaxial layer 40 over emitter pedestal 18, poly Si of the emitter pedestal 18 and silicon dioxide layer 16 below emitter pedestal 18, which are to replace sacrificial emitter pedestal 18 with in-situ doped poly Si emitter directly contacting intrinsic base region vertically between the two nitride spacers 30, and to define an emitter 21 of the bipolar junction transistor 100, as shown in FIG. 6. Since selective epitaxial layer (extrinsic base layer) 40 is formed in regions 32 to form the extrinsic base region 32 with the distance to emitter 21 defined only by spacer thickness, the emitter-base region is self-aligned. This allows for a faster bipolar junction transistor and easier integration with a CMOS transistor.

In FIG. 6, a photomask 42 is applied over emitter pedestal 18. It may use the same photomask as used in FIG. 2. Photomask 42 may include a positive resist or a negative resist; however, it is understood that photomask 42 is the opposite resist of photomask 22. For example, if photomask 22 uses a negative resist, photomask 42 uses a positive resist. If photomask 22 uses a positive resist, photomask 42 uses a negative resist.

Figure 7:
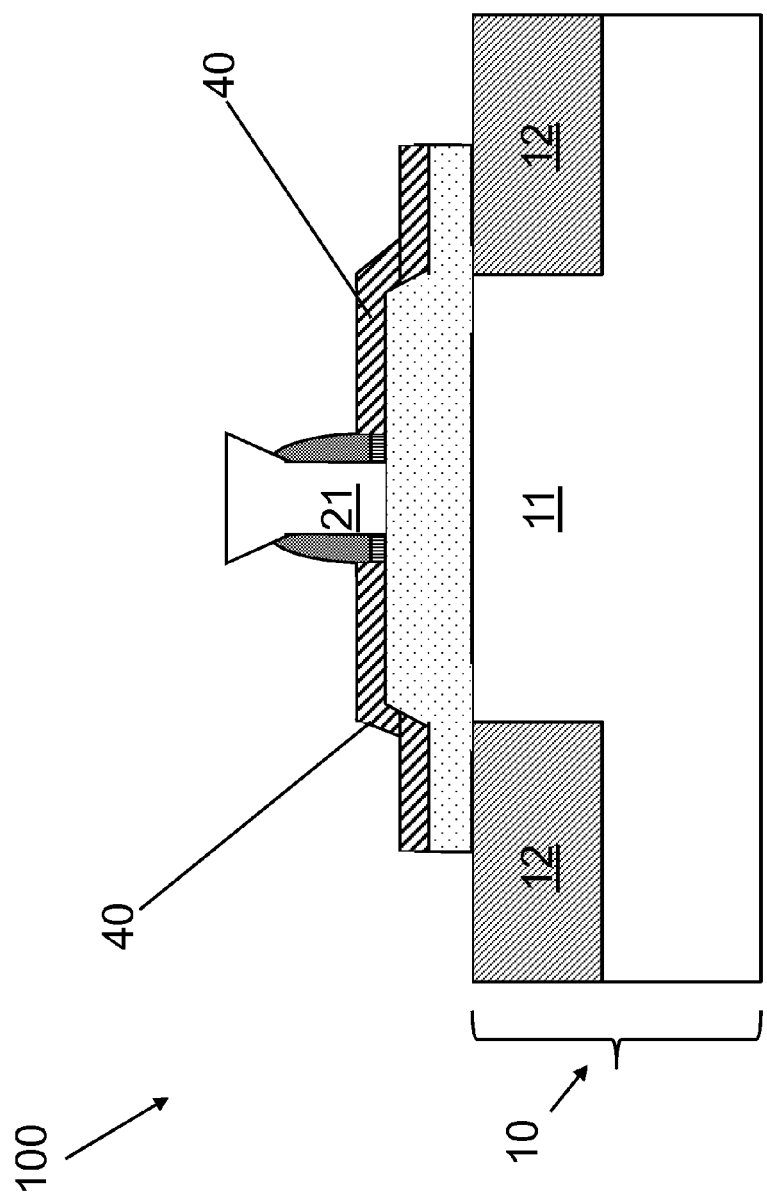
FIG. 7 shows a cross-sectional side view of a method of forming a bipolar junction transistor according to embodiments of the invention.

Turning now to FIG. 7, the base and emitter region of a bipolar junction transistor 100 according to embodiments of the invention is shown. As seen in FIG. 7, an etch is performed, using photomask 42 to remove nitride portions 34, 36 (FIG. 6), and portions of silicon dioxide layer 16 (FIG. 6) and base layer 14 over STI regions 12 to define the base 40 of bipolar junction transistor 100.

It is understood that additional processing steps for bipolar junction transistor 100, as known in the art, are needed to integrate bipolar junction transistor 100 with a CMOS device.

Figure 8:
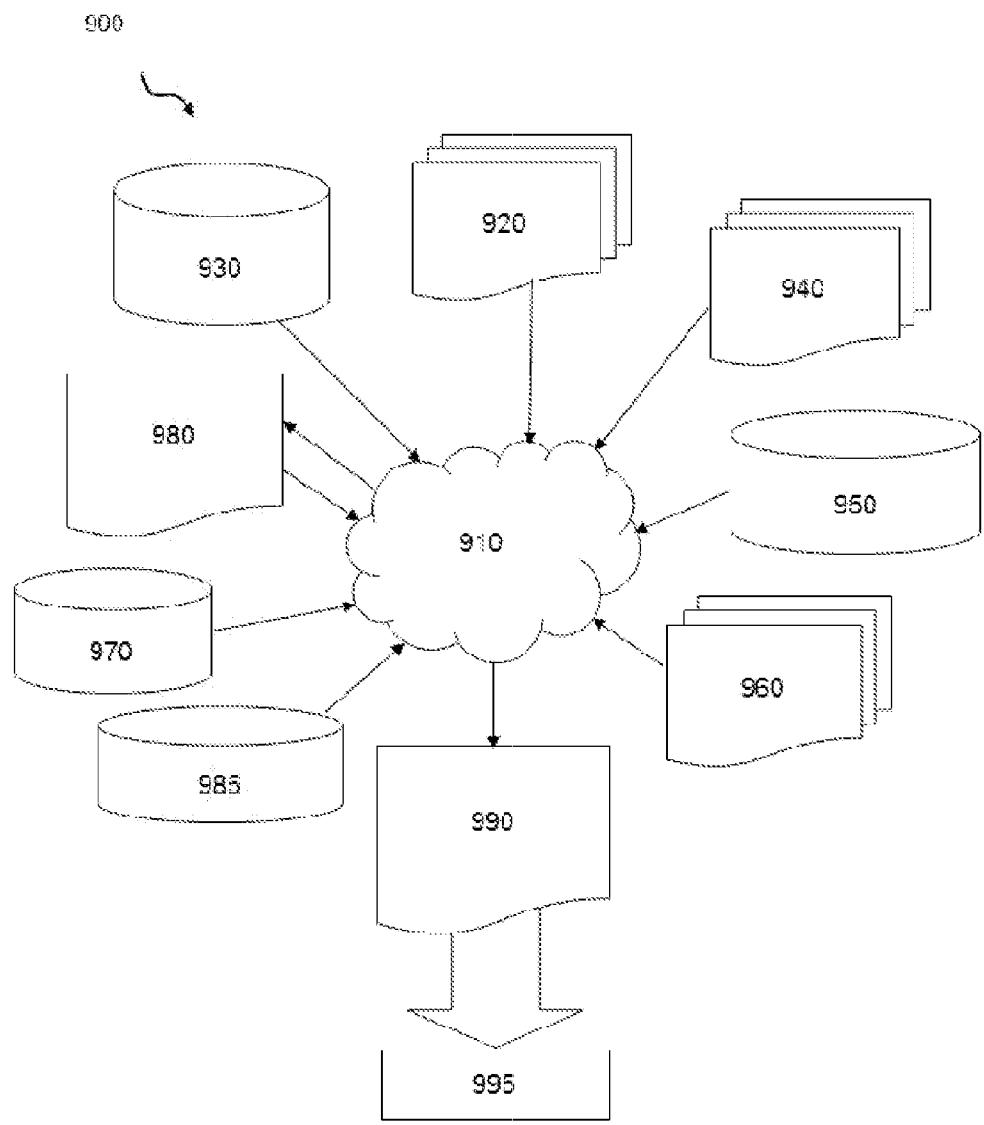
FIG. 8 is a flow diagram of a design process used in semiconductor design, manufacture, and/or test according to embodiments of the invention.

FIG. 8 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-7. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-7. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-7 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-7. In one embodiment, design structure 990 may comprise a compiled, executable HDL simulation model that functionally simulates the devices shown in FIGS. 1-7.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-7. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of forming a bipolar junction transistor, comprising:
   providing a semiconductor substrate including a uniform silicon nitride layer over an emitter pedestal, and a base layer below the emitter pedestal;
   applying a photomask at a first end and a second end of a base region; and
   performing a silicon nitride etch with the photomask to simultaneously form silicon nitride spacers adjacent to the emitter pedestal and exposing the base region of the bipolar junction transistor.

2. The method of claim 1, wherein the silicon nitride etch is an end-pointed etch.

3. The method of claim 1, further comprising etching an oxide layer above the semiconductor substrate to further expose the base region of the bipolar junction transistor.

4. The method of claim 3, further comprising etching a cap over the emitter pedestal.

5. The method of claim 1, further comprising depositing an extrinsic base layer via selective epitaxy, such that the extrinsic base layer is only within the base region.

6. The method of claim 5, wherein the extrinsic base layer is a layered structure including at least one of: silicon or silicon germanium.

7. The method of claim 1, wherein applying the photomask includes using one of: a positive or a negative resist.

8. The method of claim 7, further comprising applying a second photomask over the emitter pedestal, wherein the second photomask is an opposite polarity to a first photomask.

9. The method of claim 1, wherein a thickness of the uniform silicon nitride layer is approximately 100 Angstrom to approximately 2000 Angstroms.

10. A method of forming a bipolar junction transistor, comprising:
    providing a semiconductor substrate including a uniform silicon nitride layer over a sacrificial emitter pedestal, and a uniform silicon oxide layer and a base layer below the sacrificial emitter pedestal;
    applying a photomask at a first end and a second end of a base region;
    performing a silicon nitride etch with the photomask to simultaneously form silicon nitride spacers adjacent to the emitter pedestal and exposing the base region of the bipolar junction transistor;
    performing an oxide etch to further expose the base region of the bipolar junction transistor; and
    depositing an extrinsic base layer via selective epitaxy, such that the extrinsic base layer is only within the exposed base region.

11. The method of claim 10, wherein the silicon nitride etch is an end-pointed etch.

12. The method of claim 10, further comprising etching a cap over the emitter pedestal.

13. The method of claim 10, wherein the extrinsic base layer is a layered structure including at least one of: silicon or silicon germanium.

14. The method of claim 10, wherein applying the photomask includes using one of: a positive or a negative resist.

15. The method of claim 14, further comprising applying a second photomask over the emitter pedestal, wherein the second photomask is an opposite polarity to a first photomask.

* * * * *